US006692624B2

(12) United States Patent
Kolpakov et al.

(10) Patent No.: US 6,692,624 B2
(45) Date of Patent: Feb. 17, 2004

(54) VACUUM COATING APPARATUS

(75) Inventors: Alexandr Yakovlevich Kolpakov, Belgorod (RU); Vitaly Nikolaevich Inkin, Moscow (RU); Grigory Grigorievich Kirpilenko, Moscow (RU)

(73) Assignee: International Technology Exchange, Inc., Tucson, AZ (US)

( * ) Notice: Subject to any disclaimer, the term of this patent is extended or adjusted under 35 U.S.C. 154(b) by 23 days.

(21) Appl. No.: 10/183,545

(22) Filed: Jun. 28, 2002

(65) Prior Publication Data

US 2003/0226504 A1 Dec. 11, 2003

Related U.S. Application Data

(63) Continuation of application No. PCT/RU00/00539, filed on Dec. 28, 2000.

(51) Int. Cl.[7] .............................................. C23C 14/00
(52) U.S. Cl. ........................ 204/298.41; 118/723 VE
(58) Field of Search ................ 118/723 VE; 204/298.41

(56) References Cited

U.S. PATENT DOCUMENTS

| 4,486,287 A | * | 12/1984 | Fournier | 204/192.12 |
| 5,282,944 A | * | 2/1994 | Sanders et al. | 204/192.38 |
| 5,433,836 A | * | 7/1995 | Martin et al. | 204/298.41 |
| 5,997,705 A | * | 12/1999 | Welty | 204/298.41 |
| 6,319,369 B1 | * | 11/2001 | Flynn et al. | 204/192.38 |

FOREIGN PATENT DOCUMENTS

| DE | 3503693 | * | 10/1985 |
| GB | 2209769 | * | 5/1989 |
| SU | 273616 | * | 9/1970 |
| SU | 1074145 | * | 9/1992 |

* cited by examiner

*Primary Examiner*—Richard Bueker

(57) ABSTRACT

The present invention provides a vacuum coating apparatus to produce high quality coatings with a low degree of roughness and a high degree of thickness uniformity. The vacuum coating apparatus comprises a consumable metal cathode coupled to an arc discharge power supply and accommodated in a housing used as an anode, which is electrically coupled to a vacuum chamber and connected to the arc discharge dc power supply, a solenoid disposed on the anode, and an arc striking system connected to an initiation unit.

The present invention is suitable for producing coatings based on metals, such as titanium, aluminum, chromium, zirconium, etc., as well as for depositing wear-resistant coatings based on compounds of the above metals, e.g. titanium nitride, aluminum nitride, chromium nitride, zirconium nitride, etc. The coatings may be used to improve life and operating performance of tools and machine parts, and as decorative coatings.

8 Claims, 2 Drawing Sheets

VACUUM COATING APPARATUS

RELATED APPLICATION

This application is a continuation of PCT Patent Application No. PCT/RU00/00539, filed Dec. 28, 2000, the disclosure of which is incorporated by reference in its entirety for all purposes.

TECHNICAL FIELD

The present invention relates to an apparatus for applying coatings and in particular to a vacuum coating apparatus.

BACKGROUND

A vacuum coating apparatus is known e.g. from V.A. Osipov et al. (*Journal of Experimental Instruments and Methods*, No.6, 1978, pages. 173–176.) The apparatus comprises a vacuum chamber having a housing used as an anode, a cathode, an arc power supply, an evaporator solenoid and chamber solenoids. Vacuum arc deposition of coatings is effected in the chamber with separation of streams of charged and neutral particles.

The apparatus, however, suffers low efficiency and does not provide high-quality coatings because the stream of deposited particles contains a large proportion of macroparticles reflected from the surface of the inner walls of the vacuum chamber.

The closest prior art is a vacuum coating apparatus comprising a consumable metal cathode accommodated in a housing used as an anode, a solenoid mounted on the anode, the anode being in communication with and electrically coupled to a vacuum chamber, and connected to an arc discharge dc power supply, the consumable metal cathode being connected to the arc discharge dc power supply, and a capacitor with a ballasting resistor shunted to the arc discharge dc power supply. The apparatus further comprises an arc striking system including a starter electrode and a dielectric insert (see e.g. Aksenov I. I. et al. *Journal of Experimental Instruments and Methods*, No. 3, 1979, pages 160–162).

The apparatus, however, does not permit producing coatings with a high-quality surface, i.e. having a low degree of roughness, because the products of cathode erosion in the vacuum arc discharge contain a large proportion of drops and macroparticles which, being deposited onto the substrate surface, form micro-protrusions and pinholes in the coating, thus impairing its quality. Further, the employed arc striking system requires the application of high voltages (4.5 kV) and is insufficiently reliable. A supplemental anode adds complexity to the structure, as it is located in the immediate vicinity of the cathode with a gap. Due to internal stresses the macroparticles detaching from the cathode in the deposition process may fill the gap, thus providing an electrical short.

SUMMARY OF THE INVENTION

The object of the present invention is to provide a vacuum coating apparatus to produce high quality coatings with a low degree of roughness and a high degree of thickness uniformity. The vacuum coating apparatus of the invention comprises a consumable metal cathode coupled to an arc discharge power supply and accommodated in a housing used as an anode, which is electrically coupled to a vacuum chamber and connected to the arc discharge dc power supply, a solenoid disposed on the anode, and an arc striking system connected to an initiation unit.

Another feature of the invention is an eccentric offset of the axis of the consumable metal cathode and the anode relative to the axis of the main solenoid.

Another feature of the invention is the placement of the substrate to be coated in a region outside the cathode visibility area, where the substrate is oriented such that its surface is normal to the axis of the solenoid.

Another feature of the invention is the provision of ribs of a predetermined shape on a part of the inner surface of the anode and a design of the arc striking system to prevent the reflection of macroparticles of the deposited coating toward the substrate of the article to be coated.

Another feature of the invention is that the apparatus advantageously comprises at least one deflecting solenoid to further deflect lines of force of the magnetic field generated by the main solenoid and a supplemental solenoid in the direction of the substrate to be coated, the deflecting solenoid being disposed on the vacuum chamber.

Another feature of the invention is that the apparatus and the striking circuit are simple in design and exhibit enhanced reliability.

The present invention is suitable for producing coatings based on metals, such as titanium, aluminum, chromium, zirconium, etc., as well as for depositing wear-resistant coatings based on compounds of the above metals, e.g. titanium nitride, aluminum nitride, chromium nitride, zirconium nitride, etc. The coatings may be used to improve life and operating performance of tools and machine parts, and as decorative coatings.

BRIEF DESCRIPTION OF THE DRAWINGS

The main features of the invention will become apparent upon examination of the accompanying drawings wherein.

DETAILED DESCRIPTION OF THE INVENTION

The vacuum coating apparatus of the invention comprises a consumable metal cathode coupled to an arc discharge dc power supply and accommodated in a housing used as an anode, with the anode being in communication with, and electrically coupled to a vacuum chamber and connected to the arc discharge dc power supply, a capacitor with a ballasting resistor shunted to the arc discharge dc power supply, a diode shunted to the resistor and having a polarity opposite to that of the arc discharge dc power supply, a solenoid disposed on the anode, an arc striking system, including a starter electrode and a dielectric insert, where the arc striking system is connected to an initiation unit. The consumable metal cathode and the anode are eccentric to the axis of the solenoid. The placement of the substrate to be coated is outside the cathode visibility area, with the surface to be coated normal to the axis of the solenoid. The apparatus further provides ribs on a part of the inner surface of the housing to prevent reflected macroparticles of the deposited coating from reaching the substrate to be coated, the ribs being located on a part of the inner surface of the housing between the vacuum chamber and the level of the starter electrode.

It is advantageous that the starter electrode is formed by a ring disposed coaxially with the consumable metal cathode with a gap and secured above an inoperative cylindrical surface of the cathode, and that at least one dielectric insert with a surface coated with a conductive material layer is arranged between the starter electrode and the cathode.

The ribs are preferably formed by a wire having a right triangle cross-section.

The apparatus advantageously comprises at least one supplemental solenoid disposed on the housing coaxially with the main solenoid on the side of the vacuum chamber.

The apparatus advantageously comprises at least one deflecting solenoid to further deflect lines of force of the magnetic field generated by the solenoid and the supplemental solenoid in the direction of the article to be coated, the deflecting solenoid being disposed on the vacuum chamber.

The apparatus advantageously comprises a supplemental power supply of the deflecting solenoid for changing the scanning angle by varying the magnitude of the current in the deflecting solenoid according to a predetermined routine to achieve a desired thickness uniformity of the coating being deposited.

The apparatus preferably comprises an arc starvation control unit to automatically provide striking pulses from the initiation unit when the arc starves and simultaneously de-energize at least one supplemental solenoid.

Figure 1:
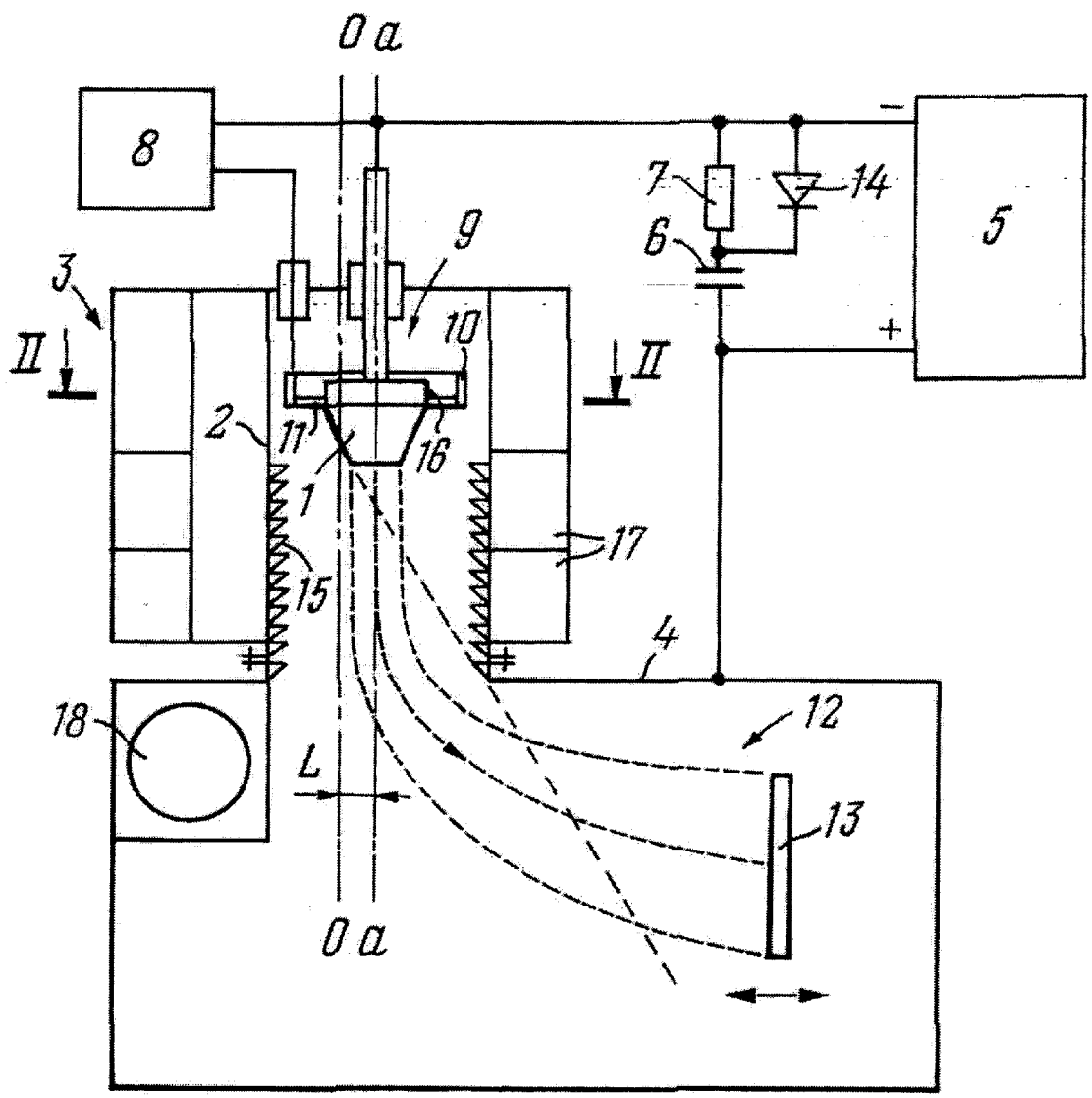
FIG. 1 shows a schematic view of a vacuum coating apparatus in accordance with the invention.
Figure 2:
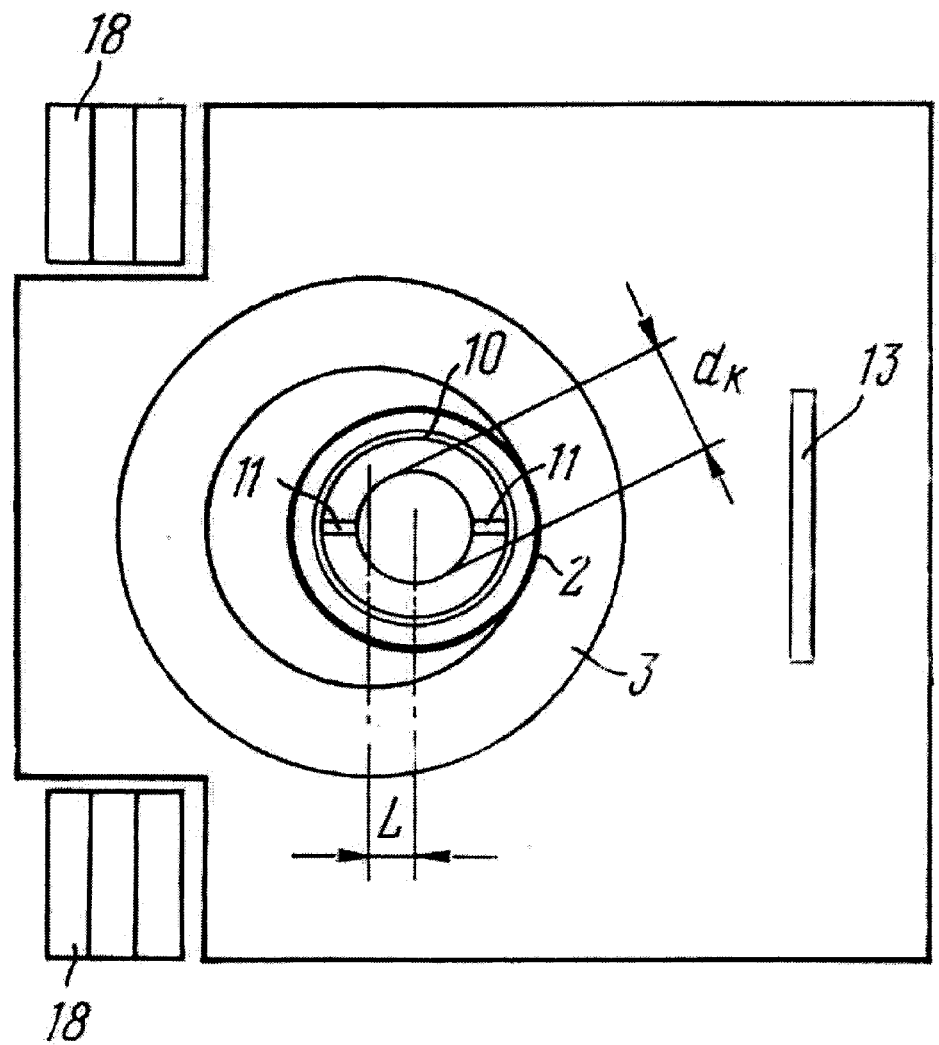
FIG. 2 shows a cross section taken at line II—II of FIG. 1.

Referring to FIG. 1, the vacuum coating apparatus of the invention comprises a consumable metal cathode 1 accommodated in a housing 2 used as an anode. A solenoid 3 is mounted on the housing 2. The anode is in communication with and electrically coupled to a vacuum chamber 4, and connected to an arc discharge dc power supply 5. The consumable metal cathode 1 is also connected to the arc discharge dc power supply 5. A capacitor 6 and a ballasting resistor 7 are shunted to the power supply 5. An arc striking system 9 comprising a starter electrode 10 and at least one dielectric insert 11 is connected to an initiation unit 8.

The consumable metal cathode 1 and the anode are eccentric to axis 0—0 of the solenoid 3, with axis a—a of the cathode 1 and the anode, respectively, being offset toward a region 12 wherein is located the substrate to be coated, or substrate, 13 at a distance L approximately equal to a diameter of the consumable metal cathode 1. The region 12 is outside the visibility area of the cathode 1 (to the right of the dashed line in FIG. 1).

The apparatus further comprises a diode 14 shunted to a resistor 7 and having a polarity opposite to that of the arc discharge power supply 5.

Ribs 15 are provided on a part of the inner surface of the housing 2 to prevent reflection of macroparticles of the deposited coating in the direction of the region 12 wherein is located the substrate to be coated 13. The ribs 15 are provided on the part of the inner surface of the housing between the vacuum chamber and the level of the starter electrode 10.

The starter electrode 10 is formed by a ring located coaxially with the consumable metal cathode 1 with a gap, and secured above an inoperative cylinder surface 16 of the cathode 1, and two dielectric inserts 11 having a surface coated with a conductive material layer are located in the gap between the starter electrode 10 and the cathode 1.

In the described embodiment the ribs 15 are formed by a wire having a right triangle cross-section.

In another embodiment (not shown), the ribs 15 are formed by rings having a right triangle cross-section.

The apparatus comprises at least one supplemental solenoid 17 mounted on the housing coaxially with the main solenoid 3 on the side of the vacuum chamber 4. FIG. 1 shows the embodiment comprising two supplemental solenoids 17.

The apparatus further comprises at least one deflecting solenoid 18 to provide further deflection of lines of force of the magnetic field generated by the main solenoid 3 and the supplemental solenoids 17 towards the region 12 wherein is located the substrate 13, the deflecting solenoid 18 being mounted on the vacuum chamber 4. The deflecting solenoid 18 is connected to a power supply (not shown in FIG. 1) to change the scanning angle by varying the magnitude of the current in the deflecting solenoid 18 according to a predetermined routine to obtain a desired thickness uniformity of the coating being deposited.

The apparatus further comprises an arc starvation control unit (not shown in FIG. 1) to automatically provide striking pulses from the initiation unit power supply 8 when the arc starves, and simultaneously de-energize at least one supplemental solenoid 17.

The vacuum coating apparatus operates in the following manner. Upon evacuation of the vacuum chamber 4 (FIG. 1), an arc discharge power supply 5 is enabled and power is supplied to the solenoid 3 and the supplemental solenoids 17. This charges the capacitor 6 via the resistor 7 and generates a magnetic field, the lines of force of which, inside the anode housing 2, are directed towards the substrate 13 as a result of the axis a—a of the cathode 1 being offset towards the substrate 13.

On enabling the initiation unit 8, a weak-current discharge occurs between the inoperative cylindrical surface 16 of the consumable cathode 1 and the starter electrode 10 over the surface of the dielectric insert 11 coated with a conductive material layer. The discharge results in generation of a cathode spot on a side surface 16 of the cathode 1 at a point of contact with the dielectric insert 11.

A second high-current initiation stage of the main arc discharge occurs at the cost of energy stored in the capacitor 6, which is discharged via the diode 14.

Then the cathode spot or spots are translated under the action of the magnetic field generated by solenoid 3 to the end face of the cathode 1. The consumable cathode 1 erodes and is transformed into a plasma. The plasma flow is deflected towards the substrate 13. The plasma ions condense and recombine on the surface of the substrate 13 resulting in the growth of a coating.

In this process, charged particles of the plasma flow are separated from uncharged macroparticles, which moving linearly, and directed by the magnetic field toward the substrate 13, which is located outside the visibility area of the consumable metal cathode 1. The ribs 15 on the inner surface of the housing 2 prevent reflection of the macroparticles in the direction of the substrate 13. This enables the deposition of a high-quality coating with a low degree of roughness.

The deflecting solenoid 18 enhances the effect of deflecting the plasma flow toward the substrate 13 by enabling scanning of the plasma flow over the surface of the substrate 13 by varying the current in the solenoid 18. This in turn may be used to decrease the thickness variation of the coating.

The diode 14 improves the reliability of striking the stationary arc discharge, as the high-current pulse discharge at the second initiation stage is effected between the consumable metal cathode 1 and the housing, anode 2. The capacitor 6 does not affect the stationary arc discharge stability because it discharges via the diode 14 and charges from the power supply 5 via the resistor 7.

Making the starter electrode 10 in the shape of a ring and using two dielectric inserts coated with a conductive material layer also improves the reliability of striking as in this case the greatest density of the initiating plasma is provided directly on the surface of the consumable metal cathode 1. The effect of the stationary arc discharge on the dielectric inserts 11 is minimal since the main stationary arc discharge occurs on the working end face of the cathode 1. Further, the ring-shaped starter electrode 10, acting as a shield against the main discharge, reduces the probability of the main discharge striking the inoperative surface 16 of the cathode 1. Provision of two supplemental coils 17 in the disclosed embodiment permits setting a required current magnitude in each of the three coils 3, 17, 17 to provide a desired configuration and magnitude of the magnetic field, and a magnetic field gradient relative to the substrate 13.

The supplemental arc starvation control unit (not shown in FIG. 1) performs two functions. First, it provides striking pulses to initiate the main arc discharge during arc starvation, and second, it de-energizes the coils 17 for this period to promote the striking conditions. Thus, the conditions are provided in which plasma reaches the housing unhindered because at this instant the magnitude of the magnetic field in the discharge initiation region is reduced. The reliability of the striking is thereby improved.

What is claimed is:

1. A vacuum coating apparatus comprising:

a consumable metal cathode accommodated in a housing used as an anode, a solenoid disposed on the anode, the anode being in communication with, and electrically coupled to a vacuum chamber, and connected to an arc discharge dc power supply, the consumable metal cathode being coupled to the arc discharge dc power supply, and a capacitor with a ballasting resistor shunted to the arc discharge dc power supply, and an arc striking system connected to an initiation unit and including a starter electrode and a dielectric insert, characterized in that the consumable metal cathode and the anode are eccentric to the axis of the solenoid, with the axis of the cathode and the anode being offset towards the region containing a substrate to be coated, the region being outside the cathode visibility area, and the offset distance approximately equal to a diameter of the consumable metal cathode, the apparatus further comprising a diode shunted to the resistor and having a polarity opposite to that of the arc discharge power supply, and ribs provided on a part of the inner surface of the housing to prevent reflection of macroparticles of the coating being deposited toward the substrate region, the ribs being located on a part of the inner surface of the housing between the vacuum chamber and the level of the starter electrode.

2. The apparatus of claim 1, characterized in that the starter electrode is formed by a ring disposed coaxially with the consumable metal cathode with a gap, and secured above an inoperative cylindrical surface of the cathode, and at least one dielectric insert having a surface coated with a conductive material layer is arranged between the starter electrode and the cathode.

3. The apparatus of claim 1, characterized in that the ribs are formed by a wire having a right triangle cross-section.

4. The apparatus of claim 1, characterized in that the ribs are formed by rings having a right triangle cross-section.

5. The apparatus of claim 1, characterized by at least one supplemental solenoid mounted on the housing coaxially with the main solenoid on the side of the vacuum chamber.

6. The apparatus of claim 1, characterized by at least one deflecting solenoid to further deflect lines of for e of the magnetic field generated by the solenoid and the supplemental solenoid in the direction of the substrate region, the deflecting solenoid being mounted on the vacuum chamber.

7. The apparatus of claim 1, characterized by a supplemental power supply of the deflecting solenoid for changing a scanning angle by varying the magnitude of the current in the deflecting solenoid according to a predetermined routine determined by a desired thickness uniformity of the coating being deposited.

8. The apparatus of claims 1 or 5, characterized by an arc starvation control unit to automatically provide striking pulses from the initiation unit when the arc starves and simultaneously de-energize at least one supplemental solenoid.

* * * * *